(12) United States Patent
Doi et al.

(10) Patent No.: US 7,990,294 B2
(45) Date of Patent: Aug. 2, 2011

(54) PARALLEL-SERIAL CONVERSION CIRCUIT AND DATA RECEIVING SYSTEM

(75) Inventors: Yoshiyasu Doi, Kawasaki (JP);
Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/620,157

(22) Filed: Nov. 17, 2009

(65) Prior Publication Data

US 2010/0141306 A1    Jun. 10, 2010

(30) Foreign Application Priority Data

Dec. 9, 2008  (JP) ................................ 2008-313680

(51) Int. Cl.
*H03M 9/00*    (2006.01)
(52) U.S. Cl. ........................ 341/101; 341/100
(58) Field of Classification Search .............. 341/101, 341/100, 147; 327/175, 263, 265
See application file for complete search history.

(56) References Cited

U.S. PATENT DOCUMENTS

| | | | | |
|---|---|---|---|---|
| 6,335,696 | B1 * | 1/2002 | Aoyagi et al. | 341/100 |
| 6,928,496 | B2 * | 8/2005 | Okajima | 710/71 |
| 7,215,263 | B2 * | 5/2007 | Dietrich et al. | 341/101 |
| 7,369,069 | B2 * | 5/2008 | Usugi et al. | 341/100 |

OTHER PUBLICATIONS

Behzad Razavi, Design of Integrated Circuits for Optical Communications, International Edition 2003, Jan. 1, 2003, pp. 333-339.

* cited by examiner

*Primary Examiner* — Brian Young
(74) *Attorney, Agent, or Firm* — Arent Fox LLP (57) ABSTRACT

A parallel-serial conversion circuit includes: a plurality of data terminals each receiving a data signal; a selection circuit configured to select at least one of the data signals received through the plurality of data terminals; a first latch circuit configured to latch an output from the selection circuit based on a clock signal; a replica selection circuit configured to select one of a plurality of signals and output the selected signal; and a timing-signal generating circuit configured to generate a timing signal for controlling the selection circuit based on the output from the replica selection circuit, wherein the output from the replica selection circuit is latched based on the clock signal.

16 Claims, 14 Drawing Sheets

| COUNT VALUE | UPPER TWO BITS | LOWER NINE BITS | | | |
|---|---|---|---|---|---|
| 0 | 00 | 000000000 | 32 | 11 | 000000000 |
| 1 | 00 | 000000001 | 33 | 11 | 000000001 |
| 2 | 00 | 000000010 | 34 | 11 | 000000010 |
| 3 | 00 | 000000011 | 35 | 11 | 000000011 |
| 4 | 00 | 000000110 | 36 | 11 | 000000110 |
| 5 | 00 | 000000111 | 37 | 11 | 000000111 |
| 6 | 00 | 000001110 | 38 | 11 | 000001110 |
| 7 | 00 | 000001111 | 39 | 11 | 000001111 |
| 8 | 00 | 000011110 | 40 | 11 | 000011110 |
| 9 | 00 | 000011111 | 41 | 11 | 000011111 |
| 10 | 00 | 000111110 | 42 | 11 | 000111110 |
| 11 | 00 | 000111111 | 43 | 11 | 000111111 |
| 12 | 00 | 001111110 | 44 | 11 | 001111110 |
| 13 | 00 | 001111111 | 45 | 11 | 001111111 |
| 14 | 00 | 011111110 | 46 | 11 | 011111110 |
| 15 | 00 | 011111111 | 47 | 11 | 011111111 |
| 16 | 10 | 111111111 | 48 | 01 | 111111111 |
| 17 | 10 | 011111111 | 49 | 01 | 011111111 |
| 18 | 10 | 011111110 | 50 | 01 | 011111110 |
| 19 | 10 | 001111111 | 51 | 01 | 001111111 |
| 20 | 10 | 001111110 | 52 | 01 | 001111110 |
| 21 | 10 | 000111111 | 53 | 01 | 000111111 |
| 22 | 10 | 000111110 | 54 | 01 | 000111110 |
| 23 | 10 | 000011111 | 55 | 01 | 000011111 |
| 24 | 10 | 000011110 | 56 | 01 | 000011110 |
| 25 | 10 | 000001111 | 57 | 01 | 000001111 |
| 26 | 10 | 000001110 | 58 | 01 | 000001110 |
| 27 | 10 | 000000111 | 59 | 01 | 000000111 |
| 28 | 10 | 000000110 | 60 | 01 | 000000110 |
| 29 | 10 | 000000011 | 61 | 01 | 000000011 |
| 30 | 10 | 000000010 | 62 | 01 | 000000010 |
| 31 | 10 | 000000001 | 63 | 01 | 000000001 |

PARALLEL-SERIAL CONVERSION CIRCUIT AND DATA RECEIVING SYSTEM

CROSS-REFERENCE TO RELATED APPLICATIONS

This application claims the benefit of priority from Japanese Patent Application No. 2008-313680 filed on Dec. 9, 2008, the entire contents of which are incorporated herein by reference.

BACKGROUND

1. Field

Embodiments discussed herein relate to data receiving systems.

2. Description of Related Art

The operating frequencies of circuits increases as the sizes of complementary metal oxide semiconductor (CMOS) integrated circuit processes are decreased to increase the speeds thereof. Flip-flop circuits used in high-speed interfaces operate in response to high-speed clocks of several tens of gigahertz. A certain setup time and a hold time may be set in order for the flip-flops to accurately sample data.

Figure 1:
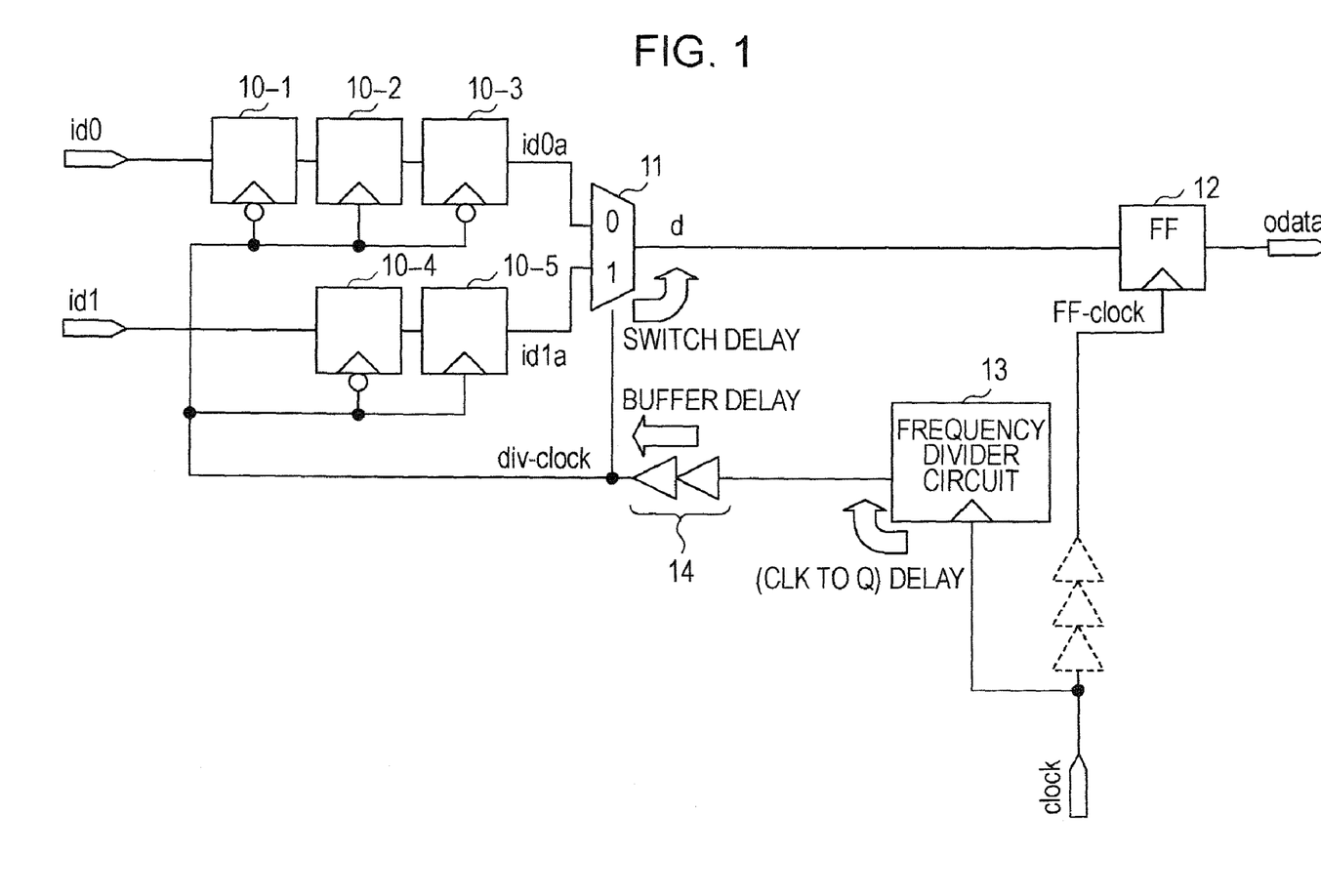
FIG. 1 illustrates an exemplary parallel-serial conversion circuit in related art.

For example, FIG. 1 illustrates a parallel-serial conversion circuit disclosed in "Behzad Razavia, 2003 'Design of Integrated Circuits for Optical Communications', International Edition 2003, (Singapore), McGraw-Hill Education, p. 333-339". The parallel-serial conversion circuit illustrated in FIG. 1 includes multiple flip-flops 10-1 to 10-5, a selection circuit 11, a flip-flop 12, a frequency divider circuit 13, and a buffer 14. The parallel-serial conversion circuit converts two-bit data "id0" and "id1," supplied through input terminals, into one-bit data "odata" having a data rate two times higher than those of the two-bit data id0 and id1.

Figure 2:
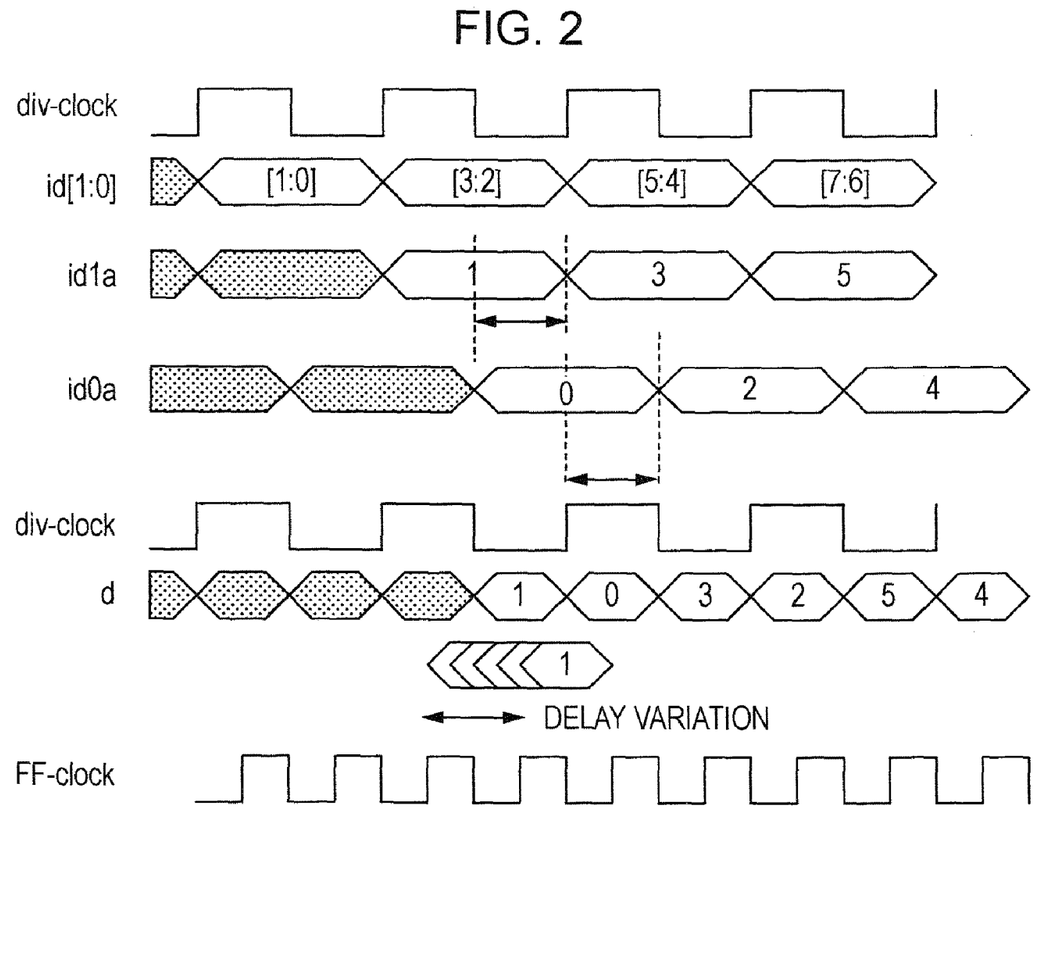
FIG. 2 illustrates an exemplary timing chart of a parallel-serial conversion circuit.

FIG. 2 illustrates an exemplary timing chart of the parallel-serial conversion circuit in FIG. 1.

SUMMARY

According to one aspect of the embodiments, a parallel-serial conversion circuit is provided which includes a plurality of data terminals each receiving a data signal; a selection circuit configured to select at least one of the data signals received through the plurality of data terminals; a first latch circuit configured to latch an output from the selection circuit based on a clock signal; a replica selection circuit configured to select one of a plurality of signals and output the selected signal; and a timing-signal generating circuit configured to generate a timing signal for controlling the selection circuit based on the output from the replica selection circuit, wherein the output from the replica selection circuit is latched based on the clock signal.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 3:
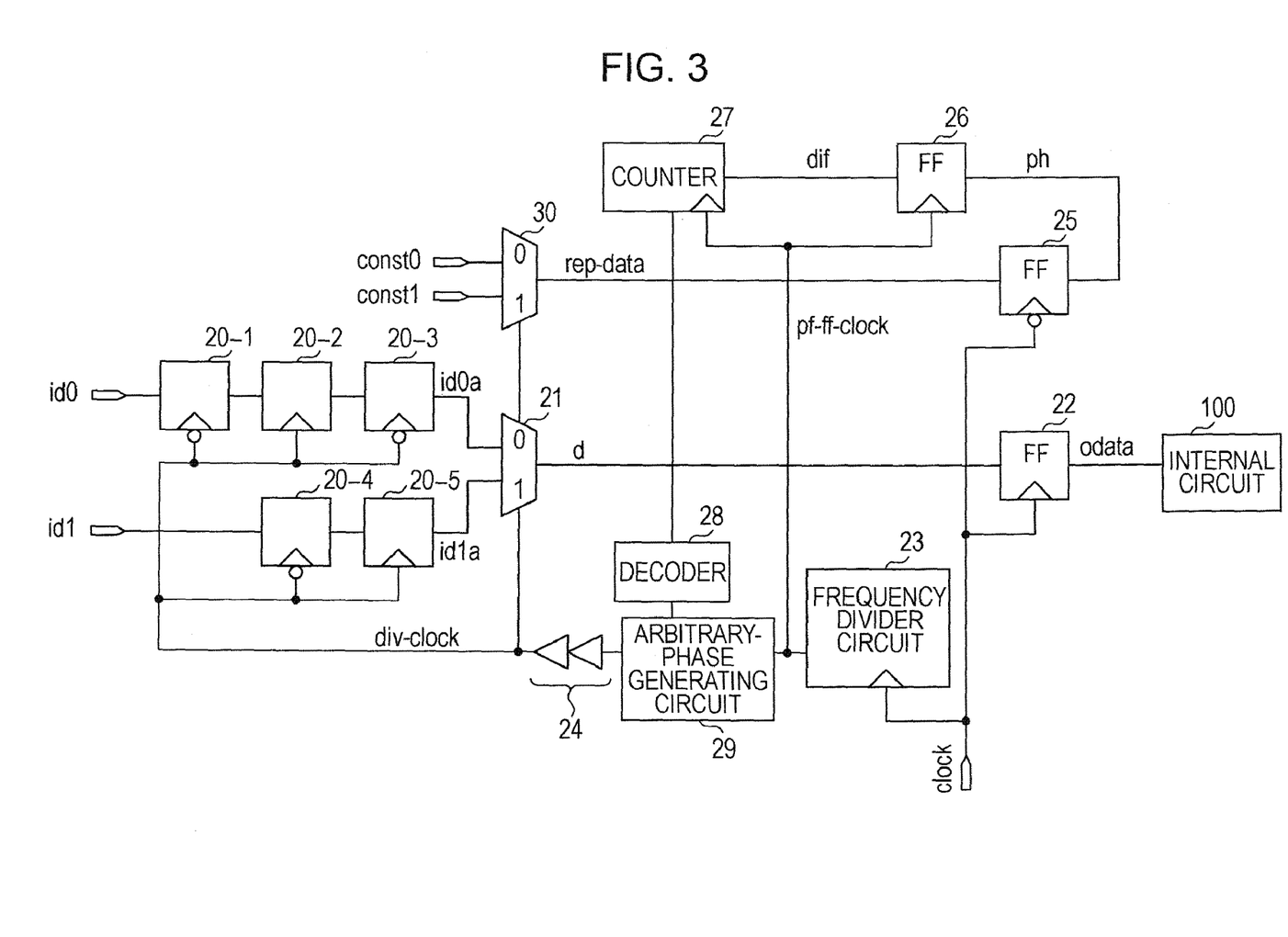
FIG. 3 illustrates a parallel-serial conversion circuit according to a first embodiment.

FIG. 3 illustrates a parallel-serial conversion circuit according to a first embodiment. The parallel-serial conversion circuit includes flip-flops 20-1 to 20-5, a selection circuit 21, a flip-flop 22, a frequency divider circuit 23, a buffer 24, flip-flops 25 and 26, a counter 27, a decoder 28, an arbitrary-phase generating circuit 29, and a selection circuit 30. The parallel-serial conversion circuit converts two-bit data "id0" and "id1," supplied through data terminals, into one-bit data "odata" having a data rate two times higher than those of the two-bit data id0 and id1. The data "odata" is supplied to an internal circuit 100. For example, a data receiving system may include the parallel-serial conversion circuit and the internal circuit 100.

Additionally, a clock signal clock is supplied to the flip-flop 22 and the flip-flop 25 and is also supplied to the frequency divider circuit 23. The frequency divider circuit 23 divides the frequency of the clock signal clock by two to generate frequency-divided clock signals. The arbitrary-phase generating circuit 29 may be a phase interpolation circuit and generates a frequency-divided clock signal div-clock from the multi-phase frequency-divided clock signals having different phases. The buffer 24 drives the frequency-divided clock signal div-clock in order to supply the frequency-divided clock signal div-clock to multiple circuit elements.

The data id0 is sequentially latched by the flip-flops 20-1 to 20-3 based on the frequency-divided clock signal div-clock to generate data id0a delayed for a time corresponding to one cycle of the frequency-divided clock. The data id1 is sequentially latched by the flip-flops 20-4 to 20-5 based on the frequency-divided clock signal div-clock to generate data id1a delayed for a time corresponding to half a cycle of the frequency-divided clock. Accordingly, the data id0a shifts in phase from the data id1a by 180°.

The selection circuit 21 selects the data id0a or the data id1a based on the frequency-divided clock signal div-clock and outputs the selected data as data d. The flip-flop 22 latches the data d in synchronization with the rising edges of the clock signal clock. The data "odata" output from the flip-flop 22 is serial output data subjected to the parallel-serial conversion.

The selection circuit 30 may be a circuit substantially the same as or similar to the selection circuit 21. The selection circuit 30 may be a replica selection circuit that operates based on a selection control signal supplied to the selection circuit 21. The selection control signal may be a timing signal used for controlling the selection operation by the selection circuit and may be, for example, the frequency-divided clock signal div-clock in FIG. 3. For example, the selection circuit 21 and the replica selection circuit 30 each select a "zero"-side input in FIG. 3 if the selection control signal is set to "0" and each select a "one"-side input in FIG. 3 if the selection control signal is set to "1". The selection circuit 30 receives data const0 and data const1. The selection circuit 30 selects either of the data const0 and the data const1 based on the frequency-divided clock signal div-clock and outputs the selected data as data rep-data. The flip-flop 25 latches the data rep-data in synchronization with the falling edges of the clock signal clock.

The flip-flop 26 latches a latch output ph from the flip-flop 25 in synchronization with a frequency-divided clock signal ph-ff-clock that is generated by the frequency divider circuit 23 and that has a frequency half of the frequency of the clock signal clock. A latch output from the flip-flop 26 is supplied to the counter 27 as data dif. The counter 27 counts up or counts down in synchronization with the frequency-divided clock signal ph-ff-clock generated by the frequency divider circuit 23. If the data dif is set to "1", the counter 27 counts up in synchronization with the frequency-divided clock signal ph-ff-clock. For example, the counter 27 increments the count value by one in response to the rising of each pulse of the frequency-divided clock signal ph-ff-clock. If the data dif is set to "0", the counter 27 counts down in synchronization with the frequency-divided clock signal ph-ff-clock. For example, the counter 27 decrements the count value by one in response to the rising of each pulse of the frequency-divided clock signal ph-ff-clock. The decoder 28 decodes the count value output from the counter 27 to convert the decoded count value into an appropriate code, for example, a thermometer code. The arbitrary-phase generating circuit 29 generates the frequency-divided clock signal div-clock from the frequency-divided clock signals supplied from the frequency divider circuit 23 based on the code output from the decoder 28. The arbitrary-phase generating circuit 29 weights the multi-phase frequency-divided clock signals having different phases in accordance with the code and combines the weighted frequency-divided clock signals to generate the frequency-divided clock signal div-clock.

In the parallel-serial conversion circuit, the selection circuit 21 selects the data id0a or the data id1a and the flip-flop 22 latches the output from the selection circuit 21 based on the clock signal clock. The replica selection circuit 30 selects one of multiple signals, for example, selects either of the signals "0" and "1" to output the selected signal. The flip-flop 25 latches the output from the replica selection circuit 30 based on the clock signal clock. The flip-flops 25 and 26, the counter 27, the decoder 28, and the arbitrary-phase generating circuit 29 generate a timing signal used for controlling each of the selection circuit 21 and the replica selection circuit 30 based on the output from the replica selection circuit 30, which is latched by the flip-flop 25. The selection circuit 21 and the replica selection circuit 30 are controlled based on the timing relationship between the selected data output from the replica selection circuit 30 and the clock signal clock. The operation timing of the selection circuit 21 and the replica selection circuit 30 are adjusted so that an appropriate timing relationship is established between the transition timing of the data d output from the selection circuit 21 and the edge timing of the clock signal clock.

Figure 4:
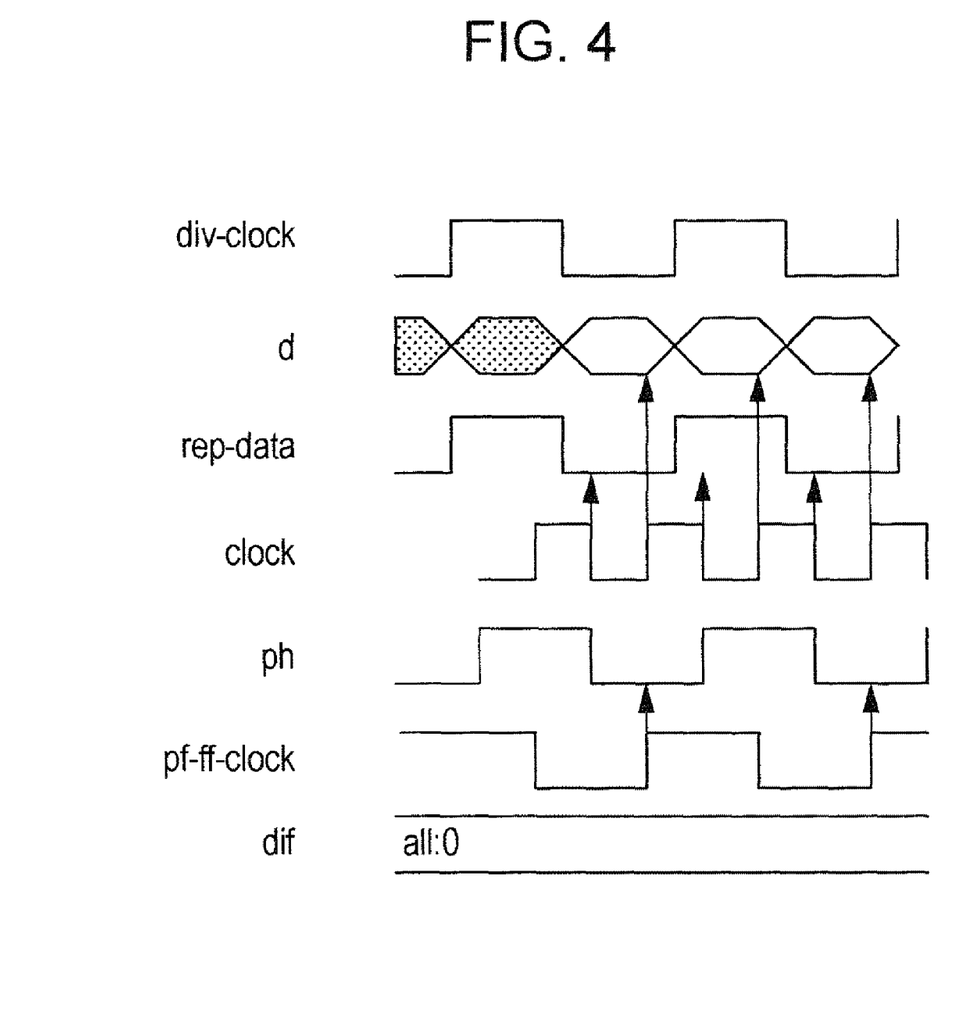
FIG. 4 illustrates an exemplary operation of a parallel-serial conversion circuit.

FIG. 4 illustrates an exemplary operation of a parallel-serial conversion circuit. The parallel-serial conversion circuit illustrated in FIG. 4 may be the parallel-serial conversion circuit in FIG. 3. Referring to FIG. 4, the timing of the rising edges of the clock signal clock is behind the data d to be latched as the serial data in the parallel-serial conversion. The data d is generated in synchronization with the high level (HIGH) and the low level (LOW) of the frequency-divided clock signal div-clock. The data rep-data from the replica selection circuit is synchronized with the high level and the low level of the frequency-divided clock signal div-clock and may have substantially the same transition timing as that of the data d. The data d which is latched, for example, is sampled in synchronization with the rising edges of the clock signal clock. Each rising edge of the clock signal clock is behind the corresponding center of the data d. The data rep-data which is latched, for example, is sampled in synchronization with the falling edges of the clock signal clock. The data ph is generated by sampling the data rep-data in synchronization with the falling edges of the clock signal clock. The data ph may be the latch output from the flip-flop 25 in FIG. 3. The value of the data ph is alternately varied between "0" and "1". The data ph is sampled in synchronization with the rising edges of the frequency-divided clock signal ph-ff-clock, which is the half-frequency signal of the clock signal clock, to generate the data dif, which has a value of zero.

Figure 5:
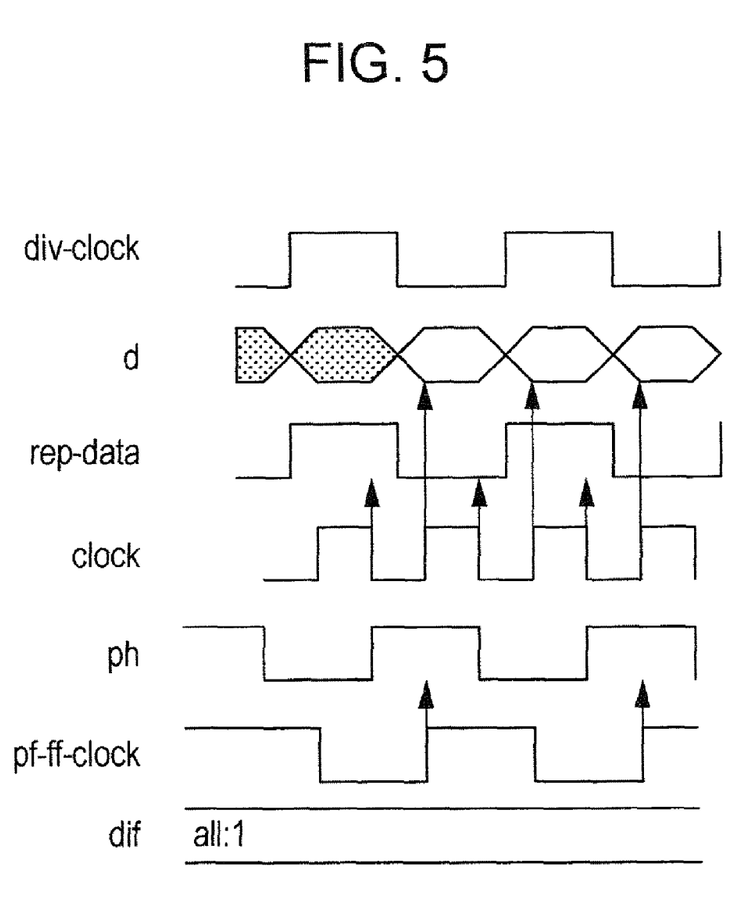
FIG. 5 illustrates another exemplary operation of a parallel-serial conversion circuit.

FIG. 5 illustrates an exemplary operation of a parallel-serial conversion circuit. The parallel-serial conversion circuit illustrated in FIG. 5 may be the parallel-serial conversion circuit in FIG. 3. Referring to FIG. 5, the timing of the rising edges of the clock signal clock is ahead of the data d to be latched as the serial data in the parallel-serial conversion. Each rising edge of the clock signal clock is ahead of the corresponding center of the data d. The data ph is generated by sampling the data rep-data in synchronization with the falling edges of the clock signal clock. The value of the data ph is alternately varied between "0" and "1". The data ph is sampled in synchronization with the rising edges of the frequency-divided clock signal ph-ff-clock, which is the half-frequency signal of the clock signal clock, to generate the data dif, which has a value of one.

Figure 6:
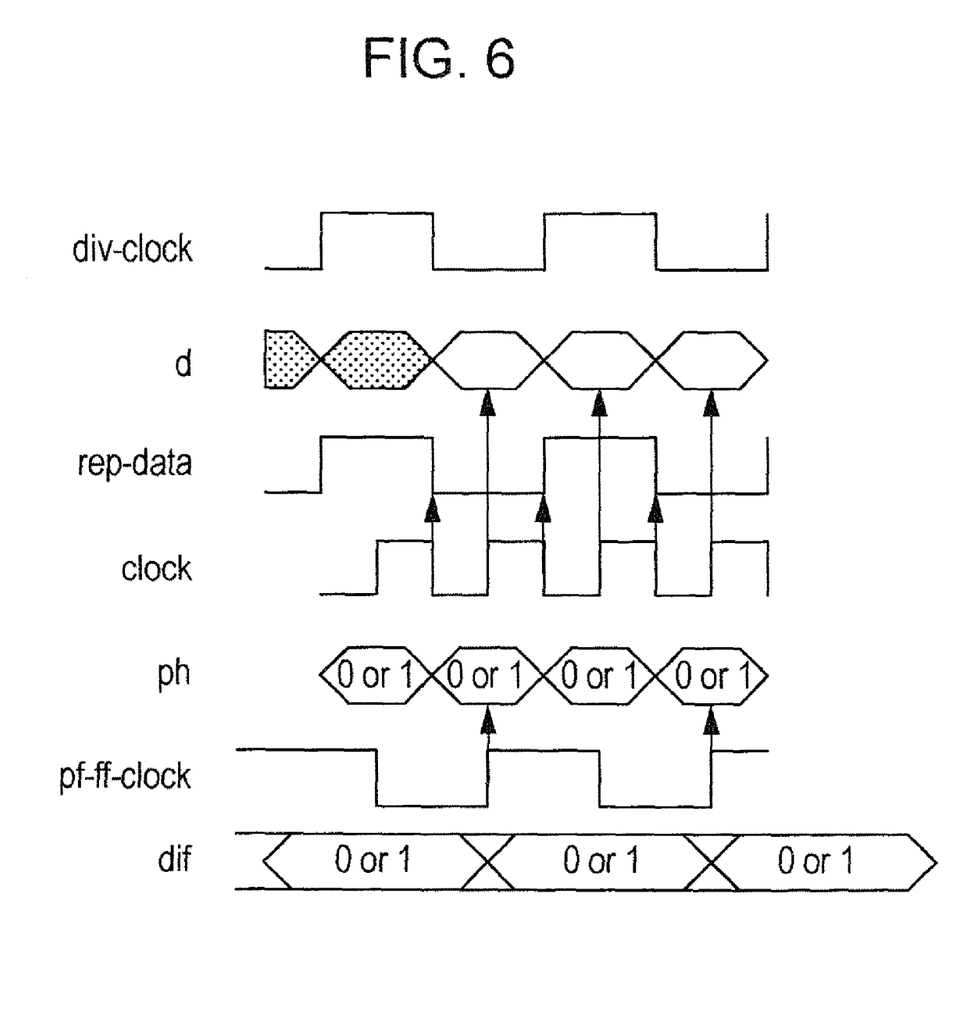
FIG. 6 illustrates still another exemplary operation of a parallel-serial conversion circuit.

FIG. 6 illustrates an exemplary operation of a parallel-serial conversion circuit. The parallel-serial conversion circuit illustrated in FIG. 6 may be the parallel-serial conversion circuit in FIG. 3. Referring to FIG. 6, the timing of the rising edges of the clock signal clock is appropriate for the data d to be latched as the serial data in the parallel-serial conversion. The timing of each rising edge of the clock signal clock is appropriate for the corresponding center of the data d. For example, the timing of each rising edge of the clock signal substantially coincides with the corresponding center of the data d. The data ph is generated by sampling the data rep-data in synchronization with the falling edges of the clock signal clock. The value of the data ph is varied between "0" and "1" at random. Since the timing of the falling edges of the clock signal clock, for example, the sampling timing, substantially coincides with the transition timing of the data rep-data, the probability of the appearance of a "0" in the data ph may be substantially the same as or similar to the probability of the appearance of a "1" in the data ph. The value of the data ph may not have a predictable bit pattern including "0" and "1" because of a shift between the sampling timing and the transition timing or a variation in the signal level at the sampling timing. Accordingly, the value of the data dif indicating the sampled value is varied at random between "0" and "1" even if the data ph is sampled (latched) in synchronization with the riding edges of the frequency-divided clock signal ph-ff-clock, which is the half-frequency signal of the clock signal clock. The probability of the appearance of a "0" in the data dif may be substantially the same as or similar to the probability of the appearance of a "1" therein.

The counter 27 counts down in synchronization with the frequency-divided clock signal if the data dif is set to "0" and counts up in synchronization with the frequency-divided clock signal if the data dif is set to "1". Accordingly, for example, if the timing of the rising edges of the clock signal clock is behind the data d to be latched as illustrated in FIG. 4, the count value of the counter 27 is decreased. Further, for example, if the timing of the rising edges of the clock signal clock is ahead of the data d to be latched as illustrated in FIG. 5, the count value of the counter 27 is increased. If the counter 27 has a low count value, it may be appropriate to delay the transition timing of the data d. The phase of the frequency-divided clock signal div-clock is delayed by the arbitrary-phase generating circuit 29. If the counter 27 has a high count value, it may be appropriate to advance the transition timing of the data d. The phase of the frequency-divided clock signal div-clock is advanced by the arbitrary-phase generating circuit 29. Such control allows the timing of the rising edges of the clock signal clock to be appropriate for the transition timing of the data d. For example, the timing of each rising edge of the clock signal substantially coincides with the corresponding center of the data d. As a result, the data dif illustrated in FIG. 6 is generated. In the data dif in FIG. 6, "1" and "0" appear at random such that the probability of the appearance of a "0" is substantially the same as that of a "1". The counter 27 has a substantially constant count value although it is finely varied and, as such, the transition timing of the data d becomes substantially constant.

Figure 7:
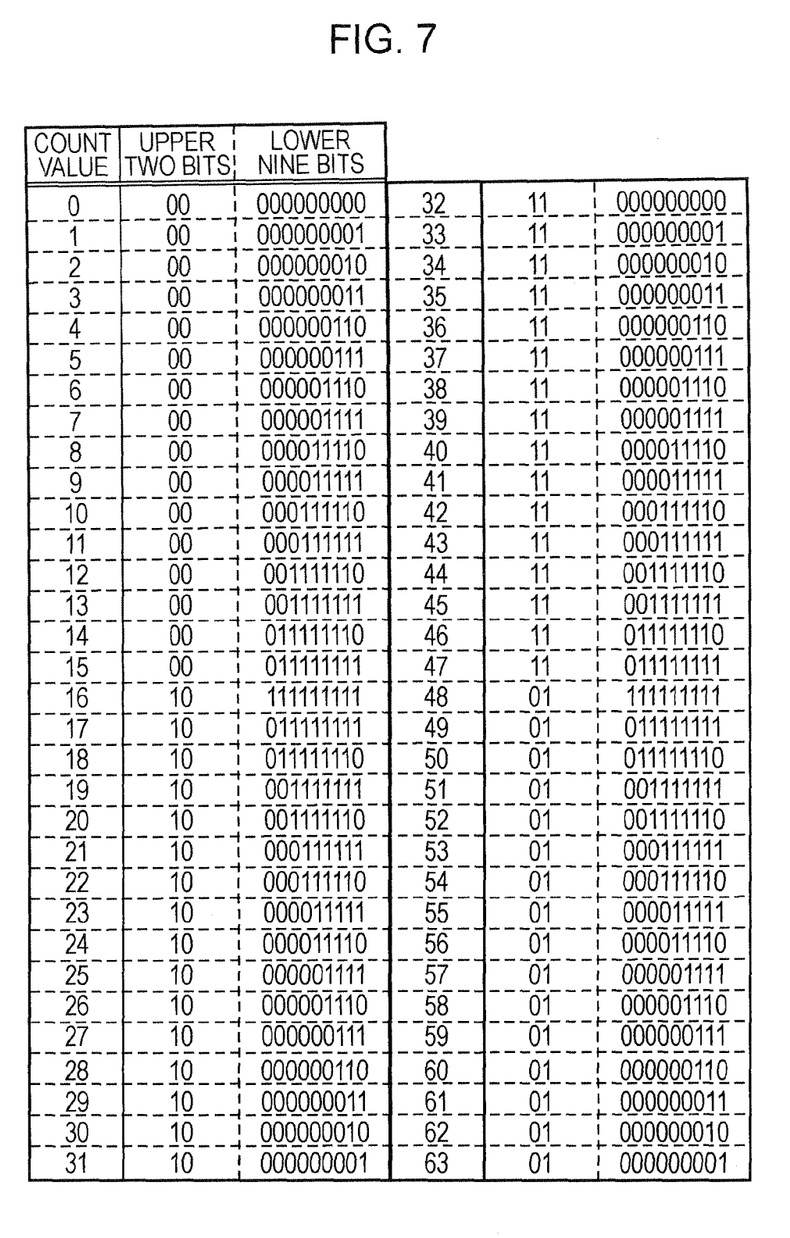
FIG. 7 illustrates an exemplary input-output relationship in a decoder.

FIG. 7 illustrates an exemplary input-output relationship in a decoder. The decoder in FIG. 7 may be the decoder 28 in FIG. 3. The table in FIG. 7 illustrates upper two bits and lower nine bits of thermometer codes that are output from the decoder in response to the count values received from the counter 27. The thermometer code is allocated to each count value so that the maximum difference in bit between the two codes corresponding to two adjacent count values is two bits. The use of such a thermometer code allows the signal processing in the arbitrary-phase generating circuit 29 downstream of the decoder to be stably and easily performed.

Figure 8:
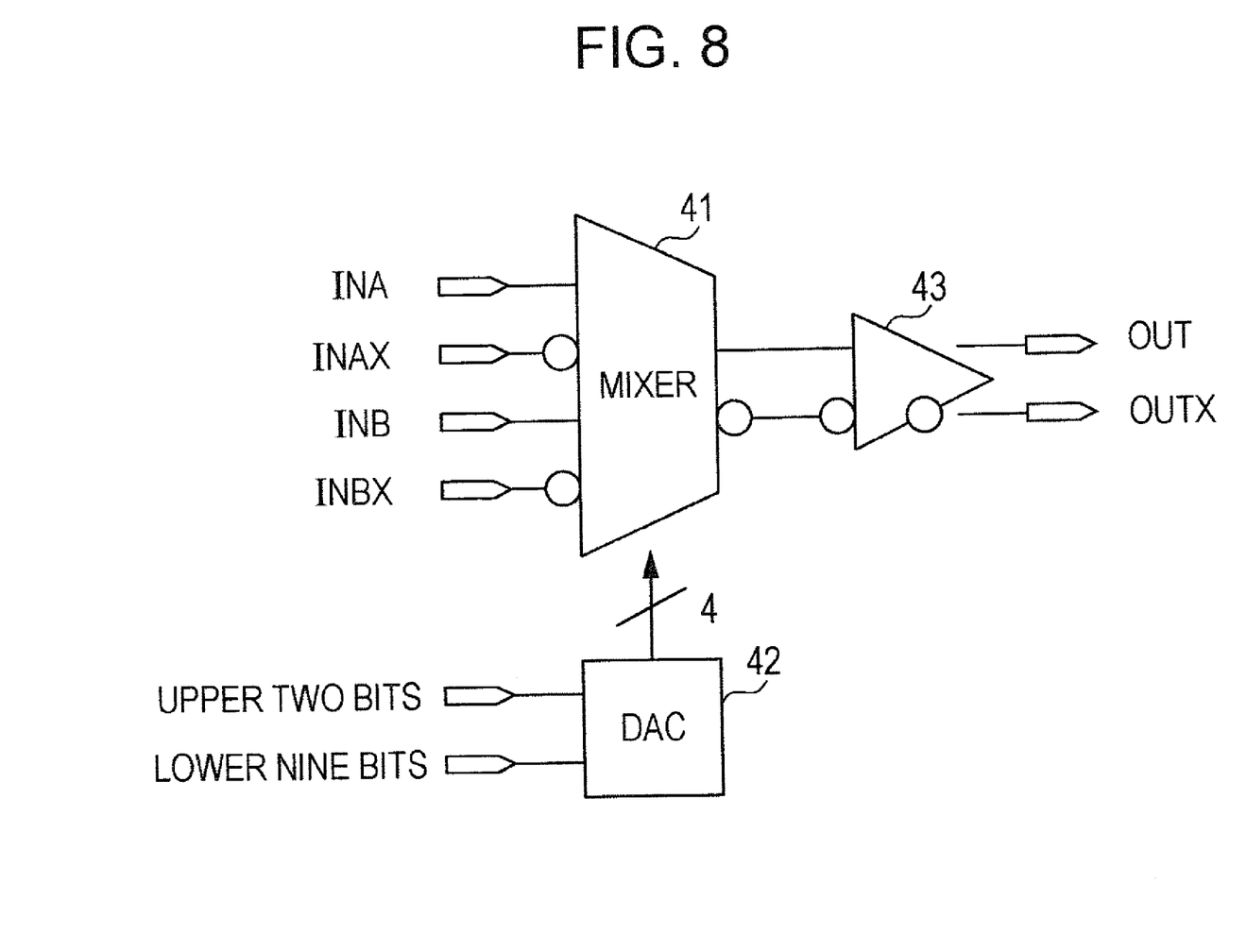
FIG. 8 illustrates an exemplary arbitrary-phase generating circuit.

FIG. 8 illustrates an exemplary arbitrary-phase generating circuit. The arbitrary-phase generating circuit illustrated in FIG. 8 may be the arbitrary-phase generating circuit 29 in FIG. 3. The arbitrary-phase generating circuit 29 may include a phase interpolation circuit. The arbitrary-phase generating circuit includes a digital-to-analog converter (DAC) 42, a mixer circuit 41, and a buffer 43. The DAC 42 receives the upper two bits and the lower nine bits of each thermometer code output from the decoder 28 and performs digital-to-analog conversion on the thermometer code to generate four analog voltage signals corresponding to the count values. The voltage values of the four analog voltage signals indicate the weights used for weighing and combining the multi-phase frequency-divided clock signals having different phases and the voltage values are supplied to the mixer circuit 41. The mixer circuit 41 weighs and combines multi-phase frequency-divided clock signals INA, INAX, INB, INBX in accordance with the voltage values of the four analog voltage signals to generate output clock signals. The output clock signals are shaped by the buffer 43 and are output from the buffer 43 as a frequency-divided clock signal OUT and its inversion signal OUTX. For example, the buffer 24 in FIG. 3 increases the driving capability of the frequency-divided clock signal OUT to output the frequency-divided clock signal div-clock. When the phase of the frequency-divided clock signal INA is 0°, the frequency-divided clock signal INAX has a phase of 180° relative to the frequency-divided clock signal INA. The frequency-divided clock signal INB has a phase of 90° relative to the frequency-divided clock signal INA. The frequency-divided clock signal INBX has a phase of 270° relative to the frequency-divided clock signal INA.

Figure 9:
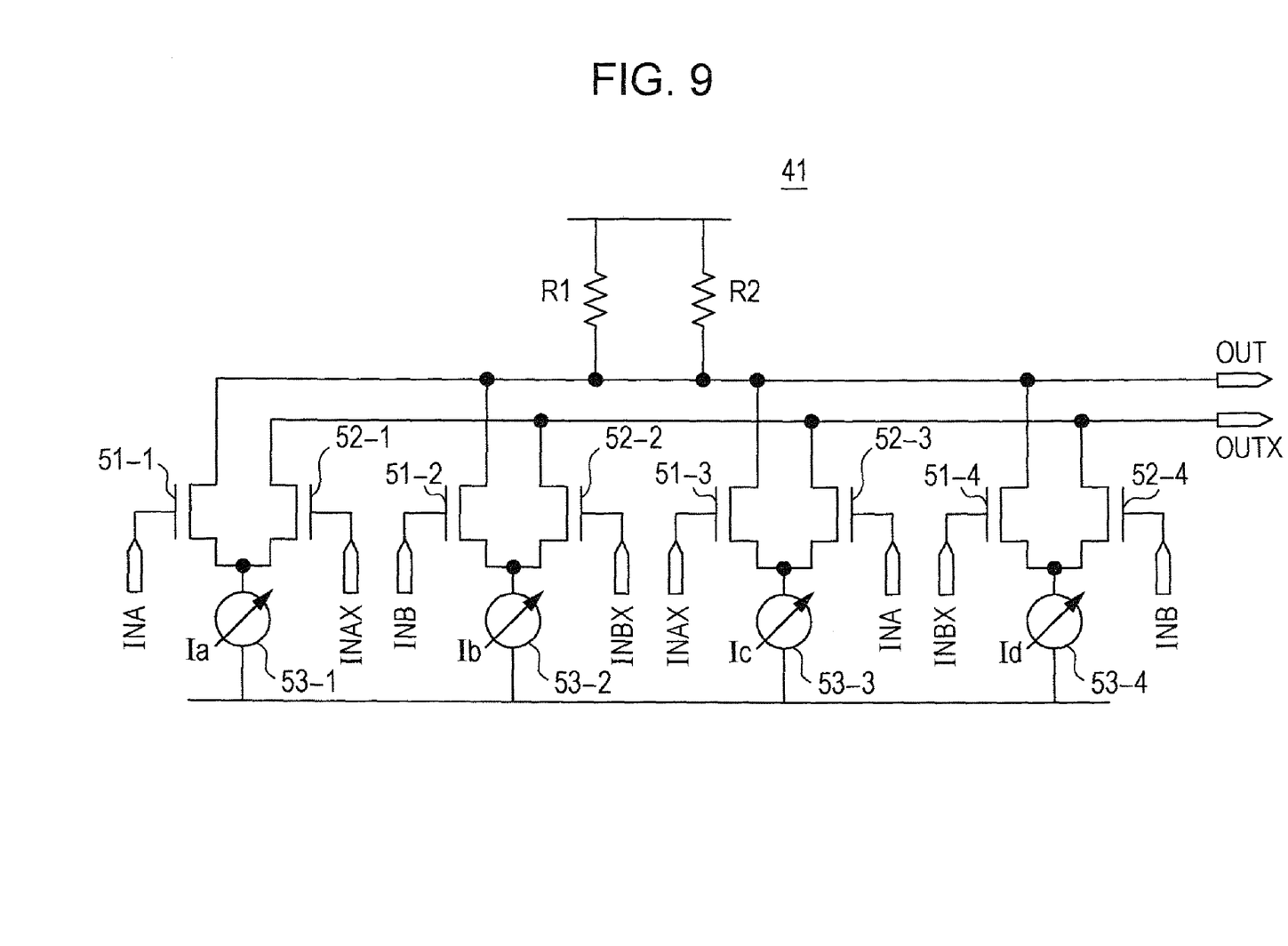
FIG. 9 illustrates an exemplary mixer circuit.

FIG. 9 illustrates an exemplary mixer circuit. The mixer circuit illustrated in FIG. 9 may be the mixer circuit 41 in FIG. 8. The mixer circuit 41 includes negative-channel metal oxide semiconductor (NMOS) transistors 51-1 to 51-4, NMOS transistors 52-1 to 52-4, current sources 53-1 to 53-4, and resistor elements R1 and R2. The frequency-divided clock signal INA and the frequency-divided clock signal INAX, which is inverted from the frequency-divided clock signal INA, are applied to the gates of the NMOS transistors 51-1 and 52-1, respectively. The amount of current flowing through the NMOS transistors 51-1 and 52-1 is controlled by the current source 53-1 to set an amount of current Ia corresponding to the first analog voltage signal from the DAC 42. The phase component at 0° in the output clock signal is adjusted. The frequency-divided clock signal INB and the frequency-divided clock signal INBX, which is inverted from the frequency-divided clock signal INB, are applied to the gates of the NMOS transistors 51-2 and 52-2, respectively. The amount of current flowing through the NMOS transistors 51-2 and 52-2 is controlled by the current source 53-2 to set an amount of current Ib corresponding to the second analog voltage signal from the DAC 42. The phase component at 90° in the output clock signal is adjusted. The frequency-divided clock signal INAX and the frequency-divided clock signal INA, which is inverted from the frequency-divided clock signal INAX, are applied to the gates of the NMOS transistors 51-3 and 52-3, respectively. The amount of current flowing through the NMOS transistors 51-3 and 52-3 is controlled by the current source 53-3 to set an amount of current Ic corresponding to the third analog voltage signal from the DAC 42. The phase component at 180° in the output clock signal is adjusted. The frequency-divided clock signal INBX and the frequency-divided clock signal INB, which is inverted from the frequency-divided clock signal INBX, are applied to the gates of the NMOS transistors 51-4 and 52-4, respectively. The amount of current flowing through the NMOS transistors 51-4 and 52-4 is controlled by the current source 53-4 to set an amount of current Id corresponding to the fourth analog voltage signal from the DAC 42. The phase component at 270° in the output clock signal is adjusted.

Figure 10:
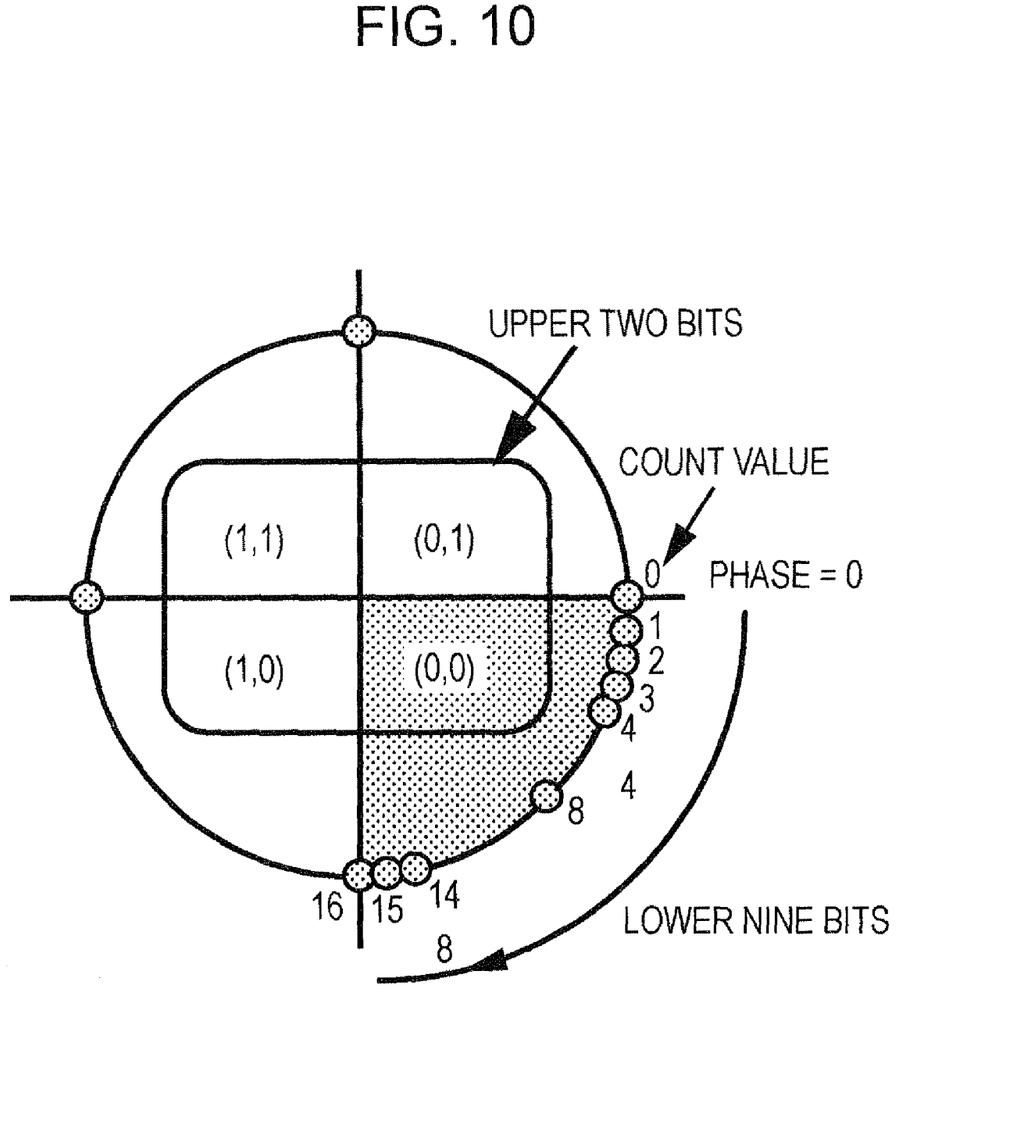
FIG. 10 illustrates exemplary count values, thermometer code, and phases.

FIG. 10 illustrates exemplary count values, an exemplary thermometer code, and exemplary phases. The relationship between count values, the upper two bits and the lower nine bits of a thermometer code, and phases is illustrated in FIG. 10. The upper two bits of the thermometer code indicate a quadrant in the phase plane. The lower nine bits of the thermometer code indicate positions on a unit circle in the phase plane, for example, indicate phases. The phase advances from $-360°$ to $-360°+(90/16)°, -360°+2\times(90/16)°, \ldots$ as the count value increases from 0 to 1, 2, . . . .

Figure 11:
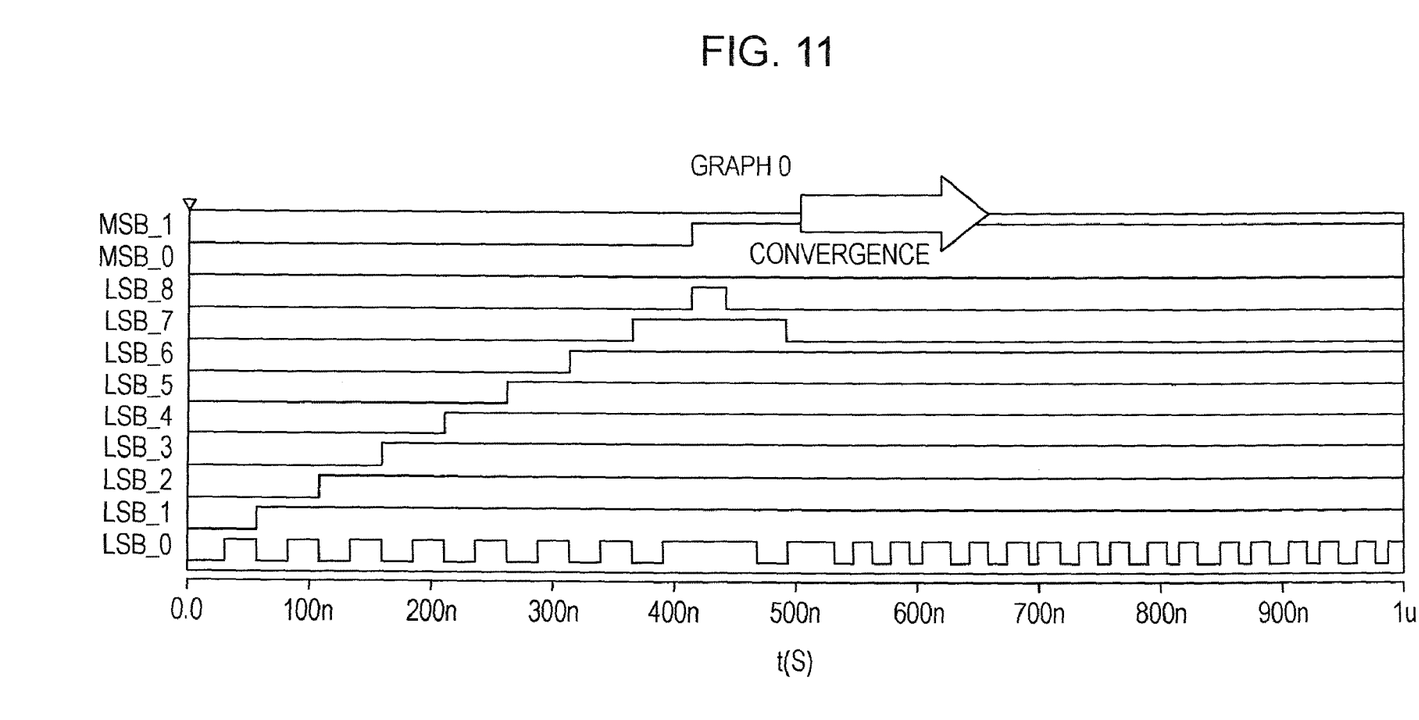
FIG. 11 illustrates an exemplary operation of a parallel-serial conversion circuit.

FIG. 11 illustrates an exemplary operation of a parallel-serial conversion circuit. The parallel-serial conversion circuit illustrated in FIG. 11 may be the parallel-serial conversion circuit in FIG. 3. Referring to FIG. 11, thermometer codes converge with the operation of the parallel-serial conversion circuit. For example, FIG. 11 may illustrate an exemplary result of a computer simulation. The horizontal axis represents time in nanoseconds. The waveforms of the upper two bits and the lower nine bits of the thermometer codes are sequentially illustrated in the vertical axis in FIG. 11. The count values increase during a period from start of the operation at 0 ns to 500 ns. For example, the thermometer codes corresponding to the count value 0 to the count value 19 in FIG. 7 are illustrated. The thermometer codes, for example, count values converge after finely varying between the thermometer code "10001111111" corresponding to the count value 19 and the thermometer code "10001111110" corresponding to the count value 20.

In order to avoid the fine phase variation, only the upper bits of the count value of the counter 27 may be used to perform the phase control. For example, the counter 27 of eight bits may be used and the upper six bits may be supplied to the decoder 28. The values of the upper six bits correspond to the count values illustrated in the table in FIG. 7.

Figure 12:
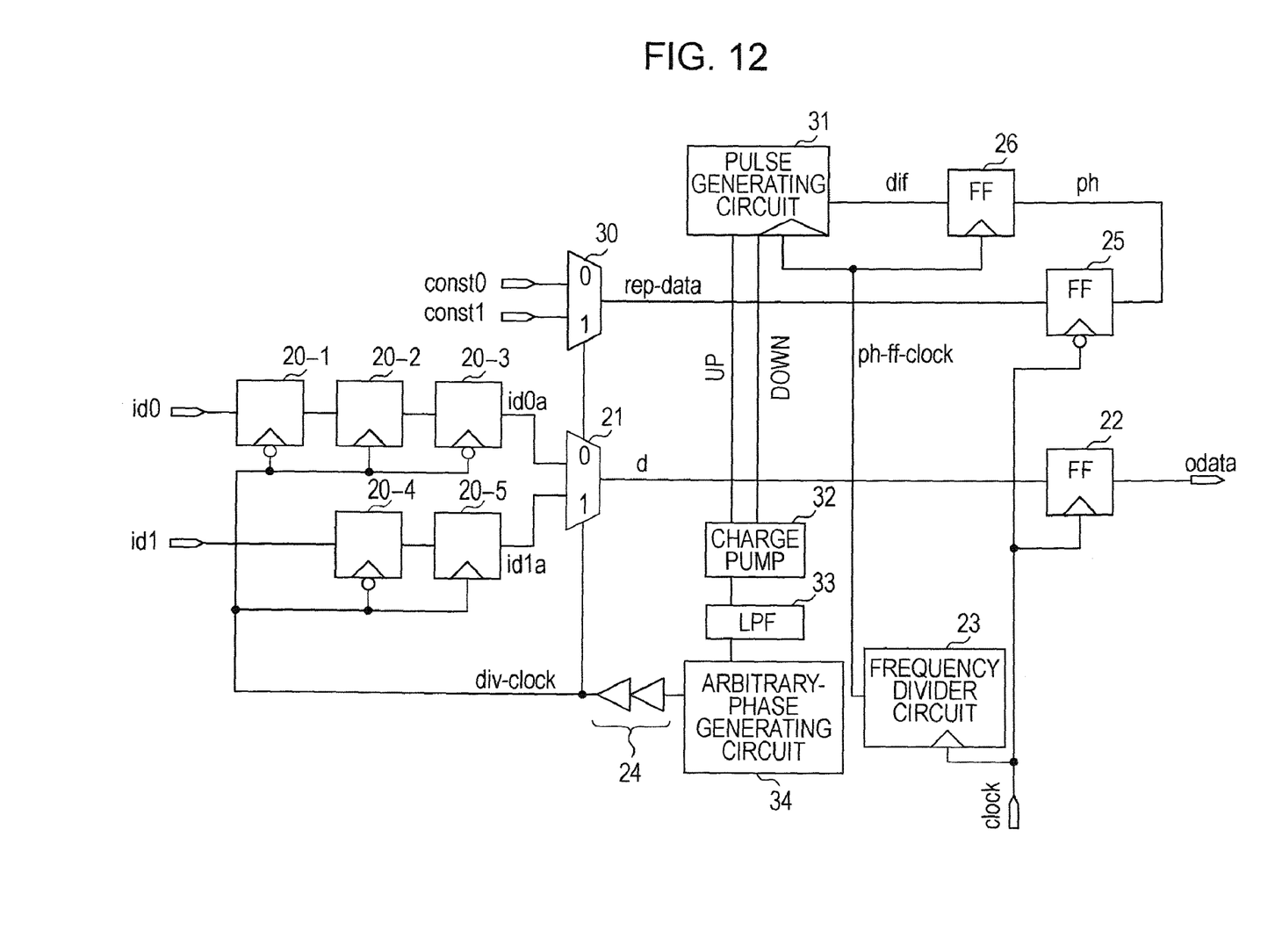
FIG. 12 illustrates a parallel-serial conversion circuit according to a second embodiment.

FIG. 12 illustrates a parallel-serial conversion circuit according to a second embodiment. The same reference numerals are used in FIG. 12 to identify the same elements in FIG. 3. As such, detailed description of the already described numeral elements is omitted or reduced. The parallel-serial conversion circuit in FIG. 12 includes a pulse generating circuit 31, a charge pump 32, a low pass filter (LPF) 33, and an arbitrary-phase generating circuit 34. The pulse generating circuit 31, the charge pump 32, the LPF 33, and the arbitrary-phase generating circuit 34 in FIG. 12 may correspond to the counter 27, the decoder 28, and the arbitrary-phase generating circuit 29 in FIG. 3. The pulse generating circuit 31 generates a HIGH pulse of a pulse signal UP instructing an increase in frequency or a HIGH pulse of a pulse signal DOWN instructing a decrease in frequency in response to "1" or "0" of the data dif supplied from the flip-flop 26. The charge pump 32 increases the amount of charge accumulated in an internal capacitive element in response to the HIGH pulse of the pulse signal UP and decreases the amount of charge accumulated in the internal capacitive element in response to the LOW pulse of the pulse signal DOWN. The charge pump 32 supplies a voltage corresponding to the charge accumulated in the internal capacitive element to the LPF 33 as a voltage signal. The LPF 33 removes the components that are finely varied from the supplied voltage signal and supplies the voltage signal to the arbitrary-phase generating circuit 34. The arbitrary-phase generating circuit 34 includes, for example, a voltage controlled oscillator (VCO). The arbitrary-phase generating circuit 34 oscillates at a frequency corresponding to the voltage output from the LPF 33. The oscillation signal output from the arbitrary-phase generating circuit 34 is supplied to the selection circuits 21 and 30 and the flip-flops 20-1 to 20-5 through the buffer 24 as a clock signal div-clock.

Figure 13:
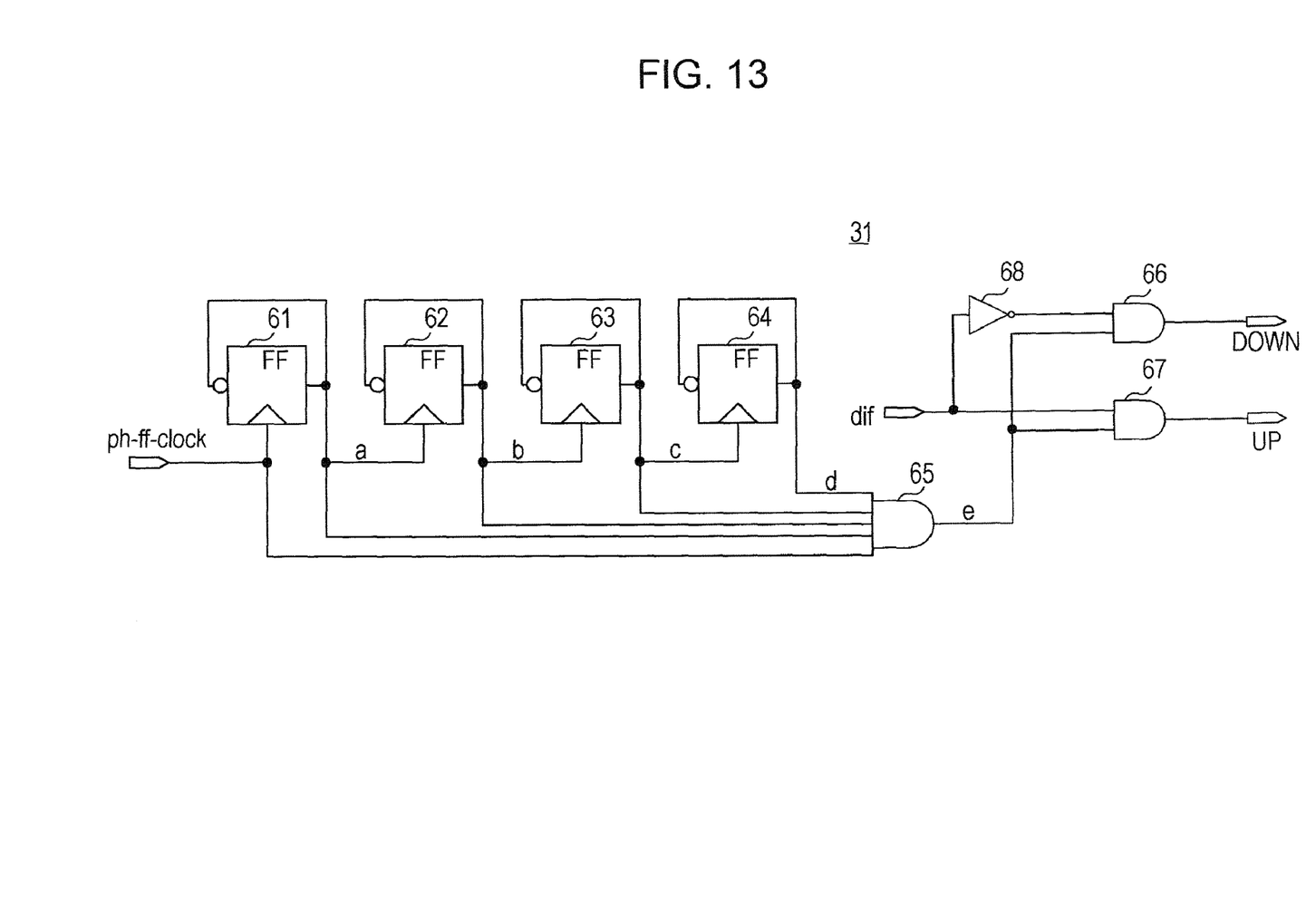
FIG. 13 illustrates an exemplary pulse generating circuit.

FIG. 13 illustrates an exemplary pulse generating circuit. The pulse generating circuit illustrated in FIG. 13 may be the pulse generating circuit 31 in FIG. 12. The pulse generating circuit 31 includes flip-flops 61 to 64, AND circuits 65 to 67, and an inverter 68. Each of the flip-flops 61 to 64 operates as a toggle flip-flop whose state is inverted in response to the rising of a signal input through its clock input terminal. A frequency-divided clock signal ph-ff-clock is input through the clock input terminal of the flip-flop 61. An output "a" of the flip-flop 61 is coupled to the clock input terminal of the flip-flop 62. An output b of the flip-flop 62 is coupled to the clock input terminal of the flip-flop 63. An output c of the flip-flop 63 is coupled to the clock input terminal of the flip-flop 64. The outputs a to d of the flip-flops 61 to 64, respectively, and the frequency-divided clock signal ph-ff-clock are supplied to the AND circuit 65.

Figure 14:
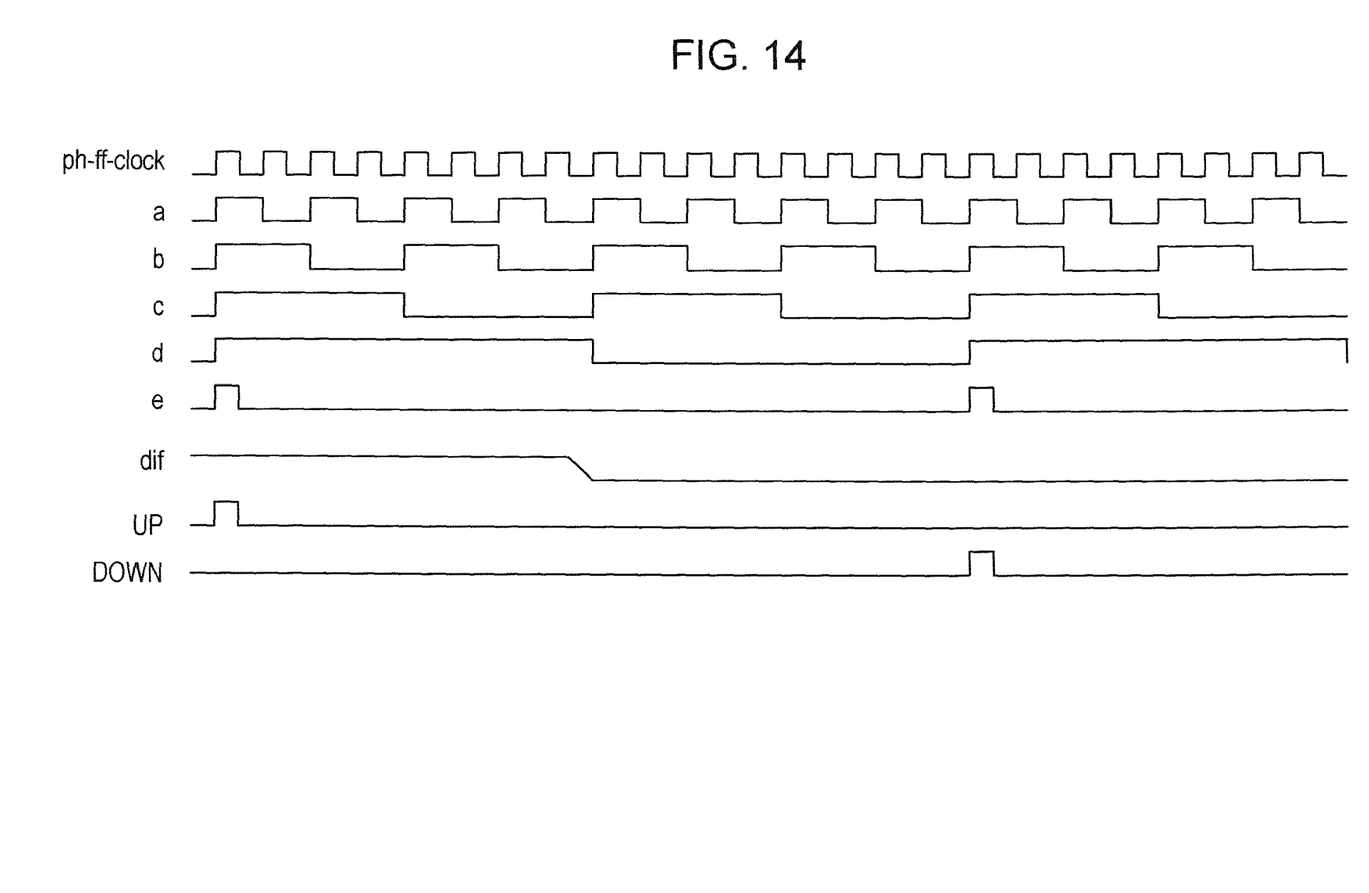
FIG. 14 illustrates an exemplary operation of a pulse generating circuit.

FIG. 14 illustrates an exemplary operation of a pulse generating circuit. The pulse generating circuit illustrated in FIG. 14 may be the pulse generating circuit 31 in FIG. 12. The AND circuit 65 outputs a signal e. The signal e becomes HIGH if the inputs a, b, c, and d and the frequency-divided clock signal ph-ff-clock, which are input into the AND circuit 65, are HIGH. The signal e is a pulse signal and becomes HIGH once every 16 cycles of the frequency-divided clock signal ph-ff-clock. When the AND circuit 67 receives the data dif from the flip-flop 26 and the signal e, it outputs a pulse signal UP. When the AND circuit 66 receives the signal e and an inversion signal of the data dif through the inverter 68, it outputs a pulse signal DOWN.

The pulse generating circuit 31 generates the pulse signal DOWN having the HIGH pulse if the data dif is set to "0". The pulse generating circuit 31 generates the pulse signal UP having the HIGH pulse if the data dif is set to "1". For example, if the timing of the rising edges of the clock signal clock is behind the data d to be latched as illustrated in FIG. 4, the voltage output from the charge pump 32 is decreased in response to the pulse signal DOWN. If the timing of the rising edges of the clock signal clock is ahead of the data d to be latched as illustrated in FIG. 5, the voltage output from the charge pump 32 is increased in response to the pulse signal UP. Accordingly, in the state in FIG. 4, as the voltage input into the arbitrary-phase generating circuit 34 is decreased, the phase of the clock signal div-clock is delayed and the transition timing of the data d is delayed. In the state in FIG. 5, the voltage input into the arbitrary-phase generating circuit 34 is increased, as the phase of the clock signal div-clock is advanced and the transition timing of the data d is advanced. Such control allows the timing of the rising edges of the clock signal clock to be appropriate for the transition timing of the data d. For example, the timing of each rising edge of the clock signal substantially coincides with the corresponding center of the data d. As a result, the data dif illustrated in FIG. 6 is generated. In the data dif in FIG. 6, "1" and "0" appear at random such that the probability of appearance of "0" is substantially the same as that of "1". As such, the transition timing of the data d becomes substantially constant.

According to the previous embodiments, the clock signal and the data having an appropriate timing relationship established therebetween are supplied to the flip-flops for data reception even if the process, the temperature, or the power voltage is varied. Accordingly, dynamic automatic control accommodating the variation in the temperature and the power voltage may be realized. Since the number of buffers that are provided for adjustment of the amount of delay is decreased to reduce the power consumption and the occupied area.

Example embodiments of the present invention have now been described in accordance with the above advantages. It will be appreciated that these examples are merely illustrative of the invention. Many variations and modifications will be apparent to those skilled in the art.

The invention claimed is:
1. A parallel-serial conversion circuit comprising:
 a plurality of data terminals each receiving a data signal;
 a selection circuit configured to select at least one of the data signals received through the plurality of data terminals;
 a first latch circuit configured to latch an output from the selection circuit based on a clock signal;
 a replica selection circuit configured to select one of a plurality of signals and output the selected signal; and
 a timing-signal generating circuit configured to generate a timing signal for controlling the selection circuit based on the output from the replica selection circuit, wherein the output from the replica selection circuit is latched based on the clock signal.

2. The parallel-serial conversion circuit according to claim 1,
wherein the timing signal is supplied to the replica selection circuit.

3. The parallel-serial conversion circuit according to claim 1,
wherein the plurality of signals have constant values.

4. The parallel-serial conversion circuit according to claim 1, further comprising:
a frequency divider circuit configured to divide the frequency of the clock signal,
wherein a frequency-divided clock signal output from the frequency divider circuit is supplied to the timing-signal generating circuit.

5. The parallel-serial conversion circuit according to claim 4,
wherein the timing-signal generating circuit includes
a counter that counts in accordance with the signal output from the replica selection circuit;
a digital-to-analog converter that outputs a weight signal used for weighting a plurality of frequency-divided clock signals based on a signal output from the counter; and
a circuit that combines the plurality of weighted frequency-divided clock signals to generate the timing signal.

6. The parallel-serial conversion circuit according to claim 1, further comprising:
a plurality of second latch circuits configured to latch the data signals supplied from the plurality of data terminals.

7. The parallel-serial conversion circuit according to claim 4,
wherein the timing-signal generating circuit includes
a pulse generating circuit that generates a pulse signal based on the frequency-divided clock signal; and
a voltage controlled oscillator that generates the timing signal based on the pulse signal.

8. The parallel-serial conversion circuit according to claim 1, further comprising:
a third latch circuit configured to latch the output from the replica selection circuit and output the latch output to the timing-signal generating circuit.

9. A parallel-serial conversion circuit comprising:
a latch circuit configured to operate in synchronization with a clock signal;
a selector configured to select one of a plurality of first data signals and output the selected first data signal to the latch circuit; and
a replica selection circuit configured to select one of a plurality of second data signals and output the selected second data signal,
wherein a phase at the time when the first data signal is selected is adjusted based on the output from the replica selection circuit and the clock signal.

10. The parallel-serial conversion circuit according to claim 9,
wherein the plurality of second data signals have constant values.

11. The parallel-serial conversion circuit according to claim 9,
wherein the phase at the time when the first data signal is selected is adjusted based on a frequency-divided clock signal generated by dividing the frequency of the clock signal.

12. The parallel-serial conversion circuit according to claim 11,
wherein the frequency-divided clock signal is weighted based on a signal output from the replica selection circuit and the first data signal is selected based on the weighted frequency-divided clock signal.

13. The parallel-serial conversion circuit according to claim 11,
wherein a pulse signal is generated based on the frequency-divided clock signal and the phase at the time when the first data signal is selected, is adjusted based on the pulse signal.

14. A data receiving system comprising:
an interface circuit configured to externally receive a data signal; and
an internal circuit configured to receive the data signal through the interface circuit,
wherein the interface circuit includes a parallel-serial conversion circuit, and
wherein the parallel-serial conversion circuit includes a plurality of data terminals each receiving a data signal;
a selection circuit configured to select at least one of the data signals received through the plurality of data terminals;
a first latch circuit configured to latch an output from the selection circuit based on a clock signal;
a replica selection circuit configured to select one of a plurality of signals and output the selected signal; and
a timing-signal generating circuit configured to generate a timing signal for controlling the selection circuit based on the output from the replica selection circuit, wherein the output from the replica selection circuit is latched based on the clock signal.

15. The data receiving system according to claim 14, wherein the timing signal is supplied to the replica selection circuit.

16. The data receiving system according to claim 14, wherein the plurality of signals have constant values.

* * * * *